United States Patent
Mitamura (10) Patent No.: US 6,831,509 B2
(45) Date of Patent: Dec. 14, 2004

(54) SWITCHING AMPLIFICATION APPARATUS (75) Inventor: Atsushi Mitamura, Hanno (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 10/450,039

(22) PCT Filed: Sep. 4, 2002

(86) PCT No.: PCT/JP02/08979
§ 371 (c)(1),
(2), (4) Date: Jun. 10, 2003

(87) PCT Pub. No.: WO03/021769
PCT Pub. Date: Mar. 13, 2003

(65) Prior Publication Data
US 2004/0124914 A1 Jul. 1, 2004

(30) Foreign Application Priority Data
Sep. 4, 2001 (JP) ......................................... 2001-267305

(51) Int. Cl.[7] ............................................... H03F 3/38
(52) U.S. Cl. ..................................... 330/10; 330/207 A
(58) Field of Search ....................... 330/10, 251, 207 A (56) References Cited

U.S. PATENT DOCUMENTS 6,373,335 B1 * 4/2002 Carver ......................... 330/10
6,586,991 B2 * 7/2003 Masuda et al. ................ 330/10
6,717,392 B2 * 4/2004 Pearson ..................... 324/76.11

FOREIGN PATENT DOCUMENTS

| JP | 55-166314 | 12/1980 |
| JP | 5-219743 | 8/1993 |
| JP | 2000-22458 | 1/2000 |
| JP | 2000-196375 | 7/2000 |

* cited by examiner

Primary Examiner—Henry Choe
(74) Attorney, Agent, or Firm—Nixon & Vanderhye P.C.

(57) ABSTRACT

To provide a new switching amplifier in which power supply switching noise is reduced to improve the quality. The switching amplifier is provided with a power amplifier (1) that has a modulator which modulates an analog signal or a multi bit digital signal into a two-level signal, and supplies an output pulse signal from this modulator to a power switching element (3); and a ΔΣ power supply (5) which is provided with a ΔΣ modulating device, and the construction is such that the output pulse signal from the modulator of the power amplifier (1) is supplied to the ΔΣ power supply (5), and also the construction is such that the ΔΣ power supply (5) receives the pulse signal as an operating clock, ΔΣ modulates the received pulse signal, and supplies the ΔΣ modulated pulse signal to the power switching element (3).

7 Claims, 5 Drawing Sheets

SWITCHING AMPLIFICATION APPARATUS

TECHNICAL FIELD

The present invention relates to a switching amplifier, which amplifies analog signals or multi bit digital signals, and relates to a new switching amplifier in which power supply switching noise is reduced to improve the quality.

BACKGROUND ART

Figure 7:
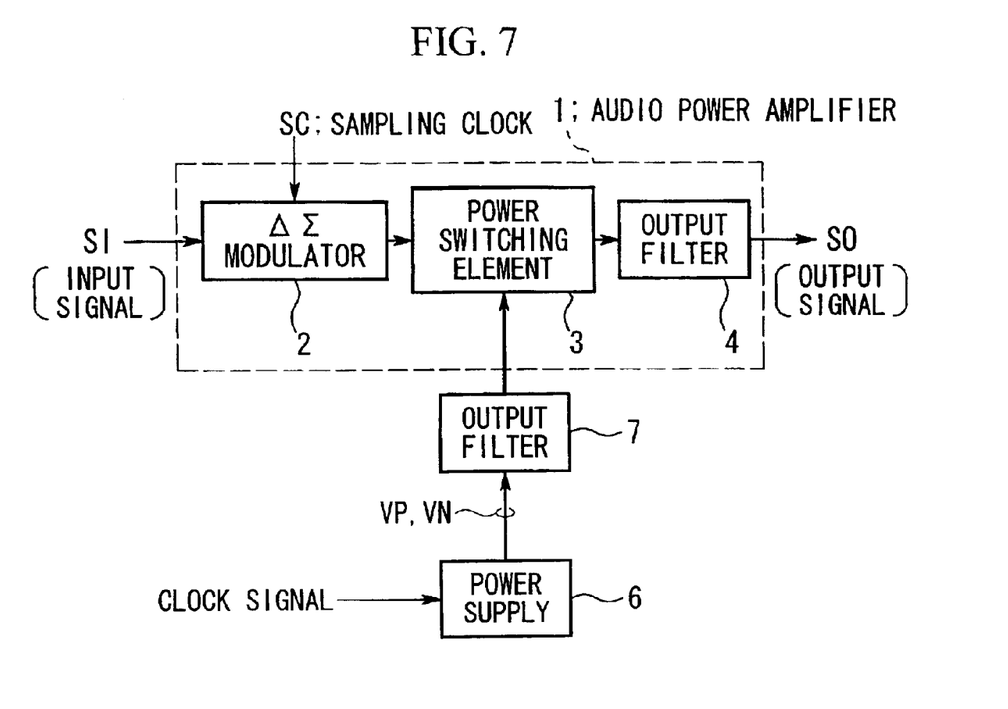
FIG. 7 is a block diagram showing a conventional example.

A switching amplifier comprising a conventional power amplifier is shown in FIG. 7. This conventional example relates to a switching amplifier for audio. This switching amplifier is provided with an audio power amplifier 1 and a power supply 6, the audio power amplifier 1 being provided with a $\Delta\Sigma$ modulator 2 for $\Delta\Sigma$ modulating an audio signal. The construction is such that an output pulse signal from this $\Delta\Sigma$ modulator 2 is supplied to a power switching element 3 in the amplifier, and then output via an output filter 4 in the amplifier. The power supply 6 is connected to this power switching element 3 in the amplifier, the construction being such that the power supply 6 receives a clock signal, performs pulse width modulation in synchronization with this clock signal, supplies this pulse width modulated signal to a power switching element in the power supply, and supplies required power to the power switching element 3 in the amplifier via an output filter in the power supply.

This conventional example of a switching amplifier operates as follows. Firstly, a signal such as an audio signal or the like is input to the $\Delta\Sigma$ modulator 2, and a sampling clock is input to this $\Delta\Sigma$ modulator 2 at the same time. The input signal is $\Delta\Sigma$ modulated by the $\Delta\Sigma$ modulator 2, and the output pulse signal thereof is input to the power switching element 3 in the amplifier. In addition, a different clock signal from the sampling clock signal is input to the power supply 6, pulse width modulation is performed in synchronization with this clock signal, and the pulse width modulated output pulse signal is input to the power switching element in the power supply. The output of the power switching element in the power supply is output through an output filter 7 in the power supply, and supplies power to the power switching element 3 in the amplifier.

However, since the power supply 6 and the power amplifier 1 are independent from each other in this method, there is a problem that switching noise from the power supply 6 easily affects the output of the power amplifier. In addition, a large output filter 7 in the power supply must be installed at the output of the power supply so that switching noise from the power supply does not affect the power amplifier 1. However, a conventional output filter 7 in the power supply is typically constructed such that a smoothing circuit and a noise filter are connected, and the installation of a noise filter in this case makes miniaturization difficult. Moreover, if construction of the output filter 7 in the power supply is attempted excluding a noise filter, it is necessary to enlarge a capacitor and a choke coil that comprise the smoothing circuit. Whichever construction is used, since the output filter 7 in the power supply is comparatively large, there is a problem that it is difficult to miniaturize the switching amplifier.

DISCLOSURE OF INVENTION

The present invention takes the above problems into consideration, with an object of providing a new switching amplifier that reduces the switching noise of a power supply, in particular to achieve an improvement in quality.

To achieve the abovementioned object, in the present invention, the timing of switching noise in the power amplifier and the power supply is almost the same, and even if noise from the power supply is mixed in, it is possible to use a common noise filter in the power amplifier. Furthermore, a noise filter for power supply is unnecessary, and it is also not necessary to have a smoothing circuit equipped with a comparatively large-sized capacitor and choke coil in the power supply output, so that it is possible to simplify the output filter of the power supply. Moreover, simplification of the power supply output filter enables the switching amplifier to be miniaturized and cost reduced.

That is, the present invention has the following construction in order to solve the above problems.

A switching amplifier according to a first aspect of the present invention comprises: a switching power amplifier which has a modulator which modulates an analog signal or a multi bit digital signal into a two-level signal, and supplies an output pulse signal from the modulator to a power switching element; and a $\Delta\Sigma$ power supply which has a $\Delta\Sigma$ modulating device which $\Delta\Sigma$ modulates an analog signal or a multi bit digital signal, and supplies a pulse signal for power supply control output from the $\Delta\Sigma$ modulating device to a power switching element in the power supply, wherein an output pulse signal of the modulator in the power amplifier is supplied to the $\Delta\Sigma$ power supply, and the output pulse signal is input as an operating clock to the $\Delta\Sigma$ power supply, and the output power of the $\Delta\Sigma$ power supply is supplied to the power switching element in the power amplifier.

A switching amplifier according to a second aspect of the present invention comprises: a power amplifier having at least a pair of power switching elements in the output stage thereof, which modulates an input signal comprising an analog signal or a multi bit digital signal into a two-level signal, and obtains an output signal power amplified by controlling the conductivity of the power switching elements complimentarily based on the two-level signal; and a switching power supply which generates a required power supply voltage to be supplied to the power switching elements by switching in synchronization with the two-level signal.

A switching amplifier according to a third aspect of the present invention is that, in a switching amplifier according to the second aspect of the present invention, an operation timing between the switching power supply and the power amplifier is set such that noise accompanying the switching operation of the switching power supply occurs within a predetermined period during which the power switching elements installed in the output stage are both off.

A switching amplifier according to a fourth aspect of the present invention is that, in a switching amplifier according to the second or the third aspects of the present invention, the switching power supply comprises a $\Delta\Sigma$ power supply, which receives the two-level signal as an operating clock signal.

A switching amplifier according to a fifth aspect of the present invention is one where, in the switching amplifier according to the fourth aspect of the present invention, the switching power supply comprises: a voltage converting section having a switching element inserted in a current path of an external power supply, and which converts the voltage of the external power supply into the required power supply voltage by switching this switching element; and a switching control section which $\Delta\Sigma$ modulates the power supply voltage converted by the voltage converting section, and controls switching of switching elements constituting the voltage converting section based on a signal obtained by this $\Delta\Sigma$ modulation.

According to the construction of this invention, the switching operation of the switching power supply is synchronized with a two-level signal which controls the conduction of a pair of power switching elements on the power amplifier side, and is synchronized with the switching of these pair of power switching elements. Consequently it is possible to match the timing of noise occurring accompanying the switching operation of the switching power supply with the timing of switching the pair of power switching elements in the output stage, so that the occurrence of switching noise on the output signal appears to be reduced virtually. Furthermore, by adjusting the timing such that noise accompanying the switching operation of the switching power supply occurs within a predetermined period during which the pair of power switching elements is off, noise accompanying the switching operation of the switching power supply does not appear on the output signal via the pair of power switching elements. As a result, it is possible to miniaturize a filter for suppressing noise accompanying the switching operation of a switching power supply or power switching elements.

BEST MODE FOR CARRYING OUT THE INVENTION

Figure 1:
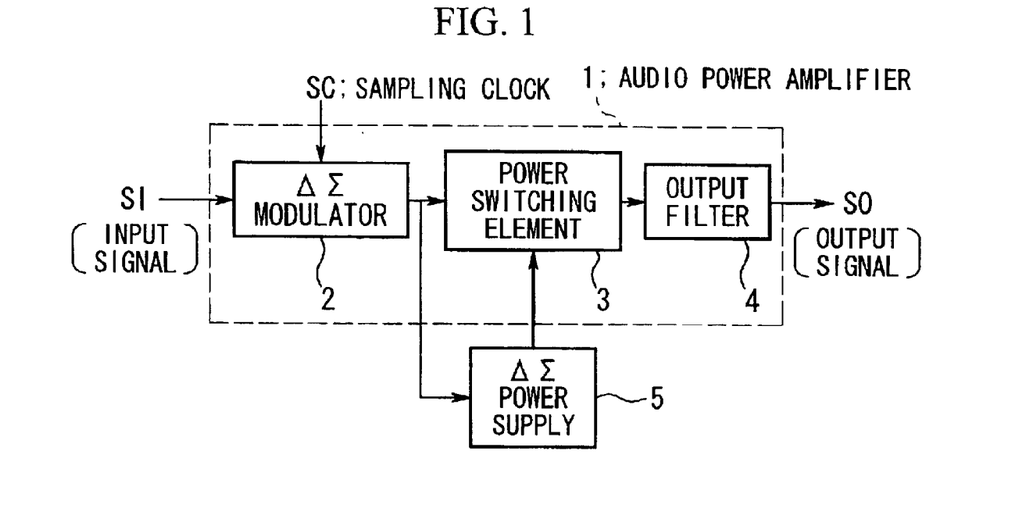
FIG. 1 is a block diagram of an example illustrating one embodiment according to the present invention

Hereunder is a description of embodiments of a switching amplifier according to the present invention with reference to the appended figures. FIG. 1 shows one embodiment according to the present invention. Furthermore, FIG. 2 shows an example of the principal part of this embodiment.

The embodiment shown in FIG. 1 is a switching amplifier in which an audio power amplifier 1 is installed. The audio power amplifier 1 is provided with a $\Delta\Sigma$ modulator 2 which $\Delta\Sigma$ modulates an audio signal, and its construction is such that an output pulse signal from this $\Delta\Sigma$ modulator 2 is supplied to a power switching element 3 in the amplifier, and then output through an output filter 4 in the amplifier.

Furthermore, the present embodiment is provided with a $\Delta\Sigma$ power supply 5. An output pulse signal from the $\Delta\Sigma$ modulator 2 in the audio power amplifier 1 is supplied to this $\Delta\Sigma$ power supply 5, and this output pulse signal is input as an operating clock to the $\Delta\Sigma$ power supply 5 to generate the required power, and the power is supplied to the power switching element 3 in the amplifier.

Figure 2:
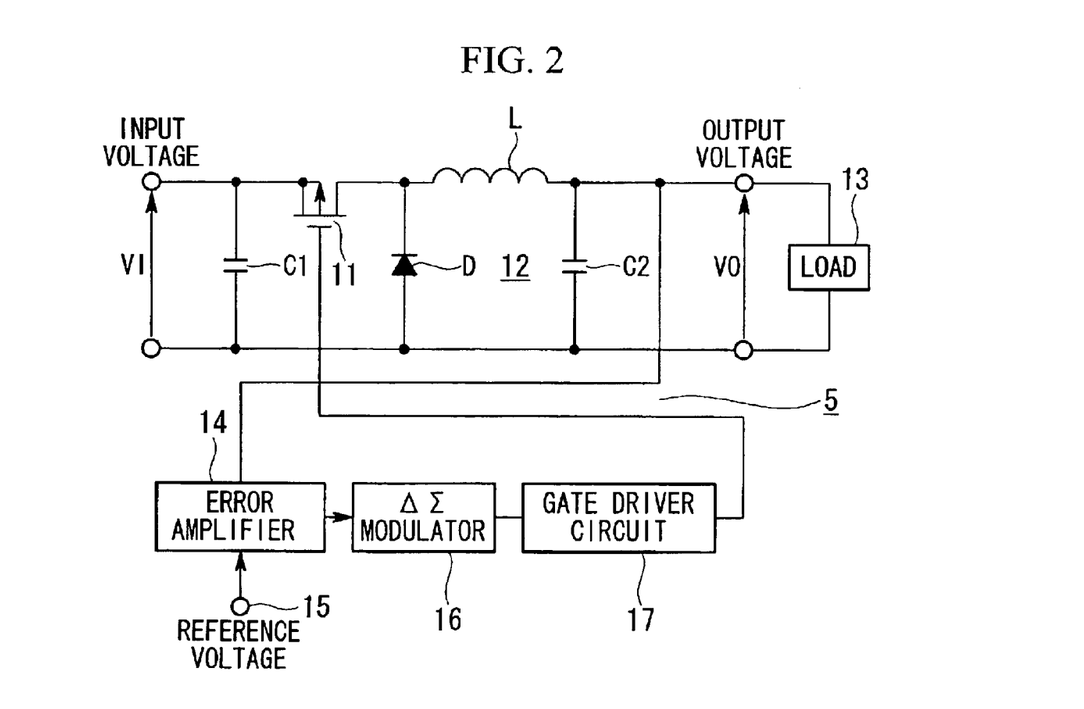
FIG. 2 is a circuit block diagram showing an example of the principal part ($\Delta\Sigma$ power supply) of the embodiment shown in FIG. 1.

A specific structure of a $\Delta\Sigma$ power supply according to the present embodiment is shown in FIG. 2. This $\Delta\Sigma$ power supply 5 is provided with a $\Delta\Sigma$ modulator 16, and supplies an output pulse signal from this $\Delta\Sigma$ modulator 16 to a power switching element 11 in the power supply. Furthermore, it is provided with a smoothing circuit 12, and the output side of this smoothing circuit 12 is connected to the $\Delta\Sigma$ modulator 16 which $\Delta\Sigma$ modulates an analog signal or a multi bit digital signal, via an error amplifier 14 which amplifies the differential voltage between the voltage output to a load 13 and a reference voltage 15, and the signal of the differential voltage between the voltage output to the load and the reference voltage 15 is amplified by the error amplifier 14, and the amplified signal is input to the $\Delta\Sigma$ modulator 16. The reference voltage 15 is the target value for the output voltage VO, and the switching operation is performed such that the output voltage VO is stabilized to the reference voltage 15. However, the output voltage VO may be lowered by a resistance type potential divider, input to the error amplifier 14, and the reference voltage 15 may be set as the target value of the voltage obtained by this resistance type potential divider. In this case, the output voltage VO is stabilized to the required voltage by the voltage obtained by the resistance type potential divider being stabilized to the reference voltage 15.

In addition, the $\Delta\Sigma$ power supply 5 as shown in FIG. 2 is just one embodiment, and any construction may be used for the $\Delta\Sigma$ power supply 5 according to the present invention provided it uses a $\Delta\Sigma$ modulation technique. Furthermore, it is not limited to a $\Delta\Sigma$ power supply, and any switching power supply may be used provided it can use a clock whose frequency is not fixed as an operating clock, that is, a variable frequency clock signal. In other words, any power supply may be used provided it can synchronize its turning on and off with a clock.

Figure 3:
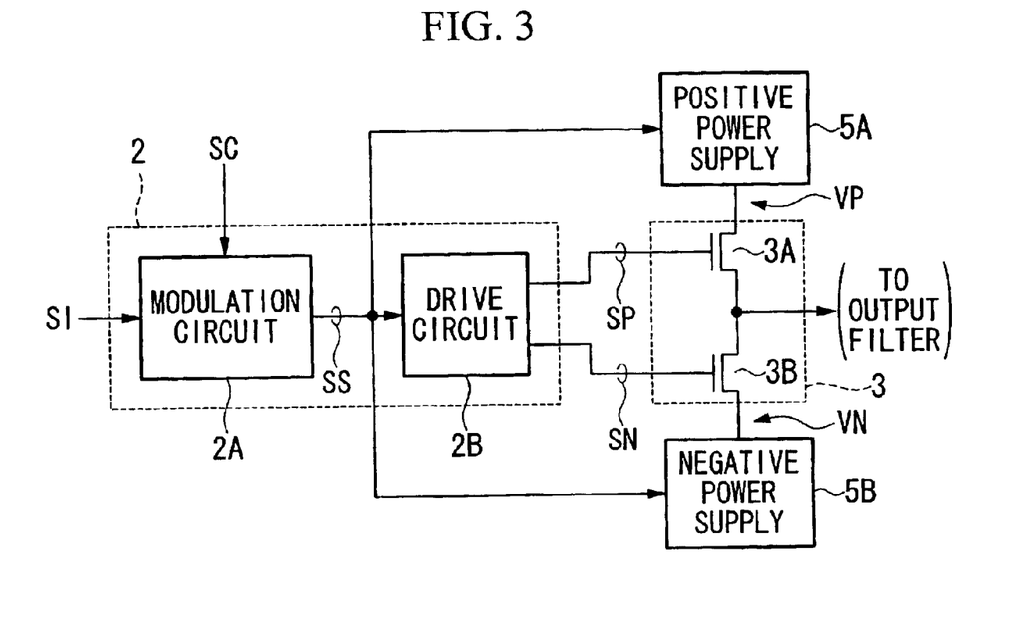
FIG. 3 shows a detailed structure of the embodiment shown in FIG. 1.

Next, FIG. 3 shows the principal part of the structure shown in FIG. 1. As shown in FIG. 3, the $\Delta\Sigma$ modulator 2 comprises a modulation circuit 2A and a drive circuit 2B. The modulation circuit 2A $\Delta\Sigma$ modulates an input signal SI and converts it to a pulsed signal SS (two-level signal). The pulse width of this pulsed signal SS is influenced by the input signal SI. The drive circuit 2B drives a power switching element 3 complementarily, based on the pulsed signal SS, and outputs driving signals SP and SN for that purpose. This modulator 2 operates with a power supply of about 5V, for example.

A positive power supply 5A and a negative power supply 5B are switching power supplies for generating the required high power supply voltages (for example, several tens volt) to be supplied to power MOS transistors 3A and 3B, and constitute the $\Delta\Sigma$ power supply 5 as shown in FIG. 1 described above. The construction is such that the positive power supply 5A and the negative power supply 5B receives the pulsed signal SS as an operating clock, and generate a positive high power supply voltage VP and a negative high power supply voltage VN by switching in synchronization with this pulsed signal SS.

That is, as shown in FIG. 2 described above, the $\Delta\Sigma$ power supply 5 comprises a stabilizing capacitor C1, the switching element 11 inserted in the current path of an external power supply (not shown in the figure), a free wheel diode D, and the smoothing circuit 12 (inductor L and capacitor C2). This functions as a voltage converting section (symbol omitted) for converting an input voltage V1 from the external power supply into a required output voltage VO. Furthermore, the $\Delta\Sigma$ power supply 5 contains the error amplifier 14, the $\Delta\Sigma$ modulator 16, and a gate driver circuit 17, in addition to the voltage converting section described above. These constitute a switching control section (symbol omitted) for controlling switching of the switching element 11.

The example shown in FIG. 2 is constructed as a step down power supply. However, it is not limited to this, and for example this may be constructed as a step up power supply. In this case, the switching element 11 is connected in series with a step up coil connected to the external power supply. However, in this case also, the construction is such that the switching element 11 is inserted in the current path of the external power supply similarly to the step down type.

Figure 4:
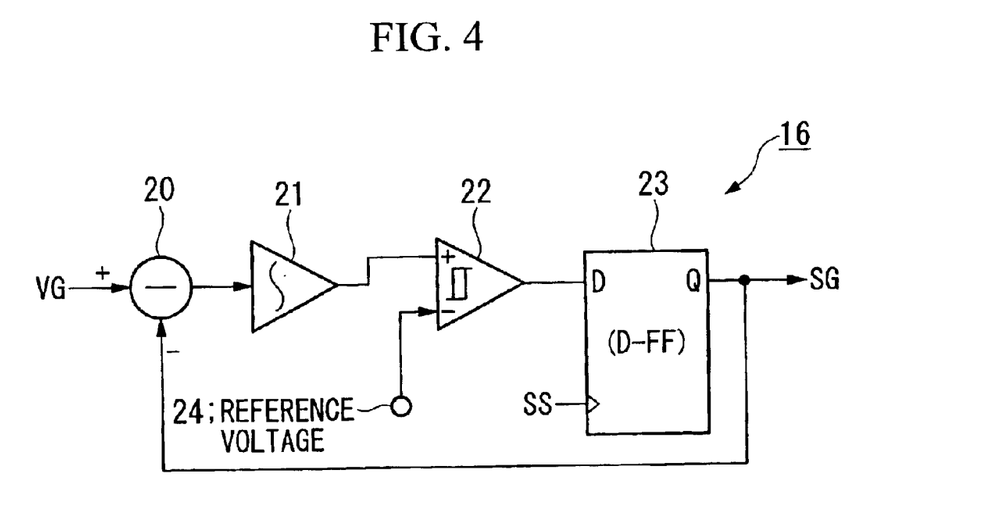
FIG. 4 shows the structure of the $\Delta\Sigma$ modulation circuit shown in FIG. 2.

FIG. 4 shows the structure of the ΔΣ modulator 16 described above. As shown in the figure, the ΔΣ modulator 16 comprises a subtractor 20, an integrator 21, a comparator 22 and a D type flip-flop (D-FF) 23. Here, the subtractor 20 subtracts a switching control signal SG from an output signal VG from the error amplifier 14 described above, and the integrator 21 integrates the output signal from the subtractor 20. The comparator 22 quantizes the output signal from the integrator 21 to a two-level signal based on a reference voltage 24, and the output signal from the integrator 21 is applied to the non-inverting input terminal thereof, and the reference voltage 15 is applied to the inverting input terminal thereof. The reference voltage 24 regulates the operation of the ΔΣ modulation, and specifically, it provides a judgment level for when the output signal (ΔΣ signal) from the integrator 21 is made binary. This reference voltage 24 is set appropriately according to the required characteristics of ΔΣ modulation. The D type flip-flop 23 latches the output signal from the comparator 22, using the pulsed signal SS output from the modulation circuit 2A described above as a clock signal.

Returning to the description of FIG. 3. The power switching element 3 comprises the pair of n channel type power MOS output transistors 3A and 3B, whose current paths are connected in series between the positive power supply 5A and the negative power supply 5B. Here, the drain of the power MOS transistor 3A is connected to the positive power supply 5A, and the driving signal SP described above is applied to its gate. The source of the power MOS transistor 3B is connected to the negative power supply 5B, and the driving signal SN described above is applied to its gate. The source of the power MOS transistor 3A and the drain of the power MOS transistor 3B are connected to each other to form the output section of the power switching element 3, which is connected to the input section of the output filter 4 in the subsequent stage.

In addition, in the example shown in FIG. 3, the pair of n channel type power MOS transistors 3A and 3B, constituting the power switching element 3, form a so-called half bridge. However, this is not limiting, and a plurality of power MOS transistor pairs may be used to form a so-called full bridge.

A switching amplifier constructed as above operates as follows. Firstly, an audio signal is input to the ΔΣ modulator 2 as an input signal SI, and also a sampling clock SC is input to the ΔΣ modulator 2. The audio signal is ΔΣ modulated by the ΔΣ modulator 2, and the output pulse signal is input to the power switching element 3 in the amplifier. Similarly, the output pulse signal of the ΔΣ modulator 2 for audio signal is input to the ΔΣ power supply 5 as a clock signal.

In general, an output signal from the ΔΣ modulator 2 has two conditions, ON and OFF, and since this change can only occur at either a rising or falling edge of the clock input to the ΔΣ modulator 16 in the ΔΣ power supply 5, switching noise generated from the power switching element 3 in the amplifier connected to the output of the ΔΣ modulator also occurs at the same time.

In the present invention, an output pulse signal from the ΔΣ modulator in the amplifier is input to the power switching element 3 in the amplifier, and is input to the ΔΣ power supply 5 as a clock signal at the same time, so that the ON and OFF changes of the power switching element 11 in the power supply occur at only either a rising or falling edge of the output pulse from the ΔΣ modulator 2 in the amplifier. As a result, the timing of switching noise from the audio power amplifier 1 and the ΔΣ power supply 5 is almost the same.

As described above, even if switching noise is mixed into the audio amplifier 1 from the ΔΣ power supply 5, since the original timing is almost the same as when the audio power amplifier 1 noise occurs, there is little influence on the audio power amplifier 1, so that it is possible to use the output filter 4 installed in the audio power amplifier 1 for the switching noise from the ΔΣ power supply 5. That is, in the present invention, a power supply output filter is not necessary for the power supply output.

Figure 5:
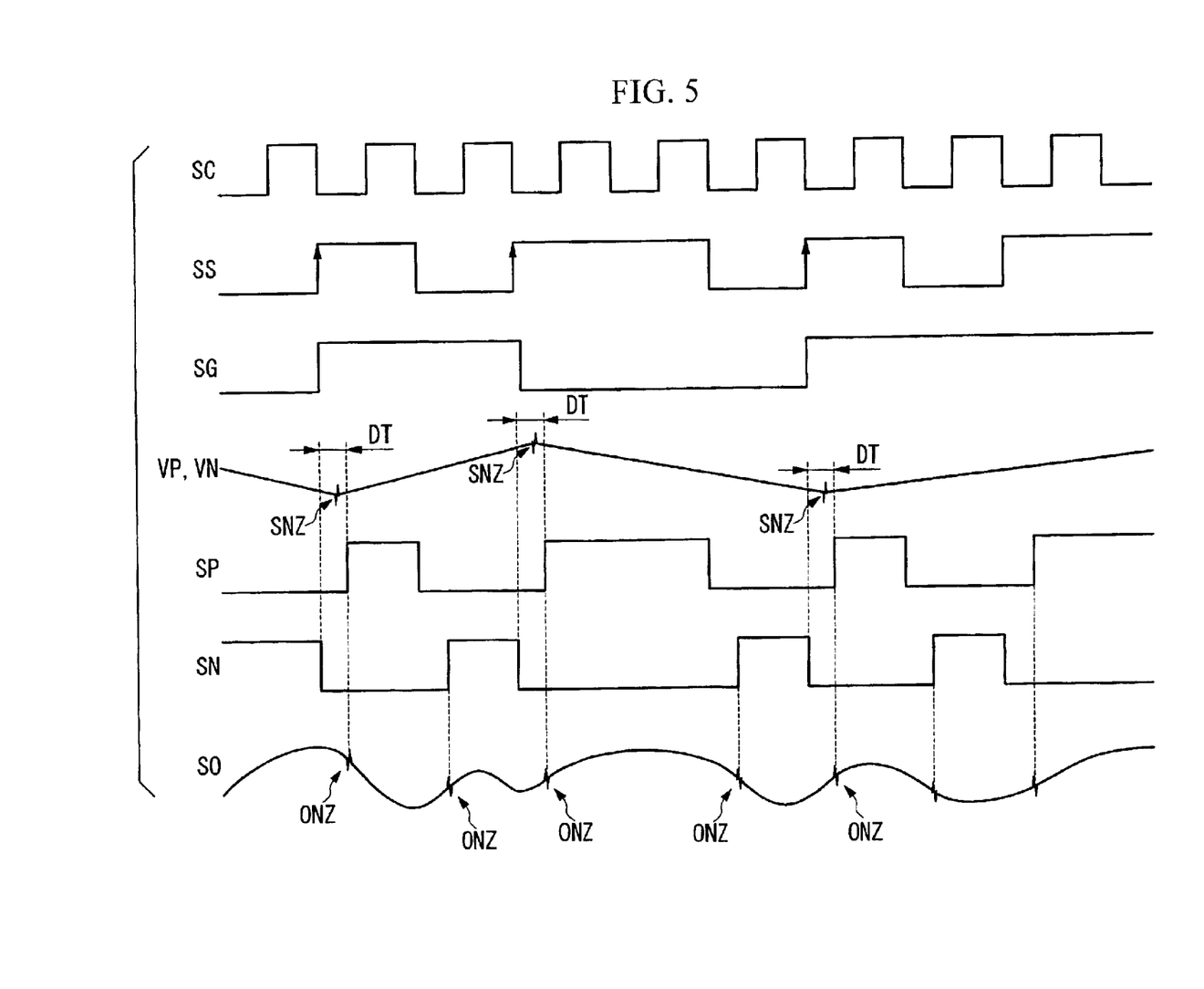
FIG. 5 is a waveform diagram to explain the operation of the present embodiment.

Next is a supplement to the operation described above with reference to signal waveforms as shown in FIG. 5. The audio power amplifier 1 modulates the input signal SI comprising an analog signal or a multi bit digital signal to a pulsed signal (two-level signal) SS. Then, a power amplified output signal SO is obtained by controlling the conductivity of the pair of power MOS transistors installed in the output stage complementarily based on the pulsed signal SS. To be specific, the modulator 2 as shown in FIG. 3 ΔΣ modulates the input signal SI based on the sampling clock SC, and outputs the pulsed signal SS. This pulsed signal SS is applied to the drive circuit 2B in the subsequent stage, and is also applied to the positive power supply 5A and the negative power supply 5B constituting the ΔΣ power supply 5.

In the high power supply 5A to which the pulsed signal SS is input, the ΔΣ modulator 16 shown in FIG. 2 and FIG. 4 generates a switching control signal SG using the pulsed signal SS as an operating clock signal, and applies this switching control signal SG to the gate of the switching element 11 as shown in FIG. 2. As a result, the high power supply 5A performs switching operations, and maintains a substantially steady high power supply voltage VP as shown in FIG. 5. In FIG. 5, the waveforms of the high power supply voltage VP show only a ripple component. Similarly, the negative power supply 5B performs switching operations based on the pulsed signal SS, and generates a substantially steady negative high power supply voltage VN.

At this time, the D type flip-flop 23 in the structure of the ΔΣ modulator 16 shown in FIG. 4 latches the output signal from the comparator 22 at the rising edge of the pulsed signal SS, and outputs this as a switching control signal SG. Hence the switching control signal SG changes at the rising edge of the pulsed signal SS as shown in FIG. 5. Therefore, switching noise SNZ caused by the switching operation based on the switching control signal SG is superimposed onto the high power supply voltages VP and VN.

On the other hand, the drive circuit 2B outputs the driving signals SP and SN in response to the pulsed signal SS output from the ΔΣ modulation circuit 2A, drives the power MOS transistors 3A and 3B complimentarily, and outputs the output signal SO via the output filter 4. The output noise ONZ occurring when the power MOS transistors 3A and 3B switch is superimposed onto this output signal SO.

Here, if the power MOS transistors 3A and 3B are both on, excessive punch-through current flows from the positive power supply 5A to the negative power supply 5B and damages the power MOS transistors 5A and 5B. Therefore, when the pair of power MOS transistors 3A and 3B provided at the output stage switches, a so-called dead time DT is provided during which both the transistors are off, and a phase difference is provided between the driving signal SP and the driving signal SN so as to create such a dead time DT.

The operating timing between the ΔΣ power supply 5 and the audio power amplifier 1 based on the pulsed signal SS is set such that the switching noise SNZ that is superimposed onto the high power supply voltages VP and VN is generated within the period (within a predetermined period) of the dead time DT. In this embodiment, it is assumed that the timing does not need to be adjusted, and the switching noise SNZ is generated within the period of the dead time DT. However, a timing setting device for adjusting this timing may be provided as required. For example, a delay circuit may be used as this device. In this case, the pulsed signal SS is divided into one to be supplied to the positive power supplies 5A and 5B, and one to be supplied to the drive circuit 2B, and one of these divided pulse signals may be delayed from the other by an appropriate amount.

In this manner, when the switching noise SNZ occurs during the dead time DT, this switching noise SNZ is cut off by the power MOS transistors 3A and 3B. Accordingly, the noise on the output signal SO is only the output noise ONZ caused by the switching operations of the power MOS transistors 3A and 3B. Consequently, noise on the output signal SO is reduced without providing any countermeasure to noise in the ΔΣ power supply 5 itself.

Figure 6:
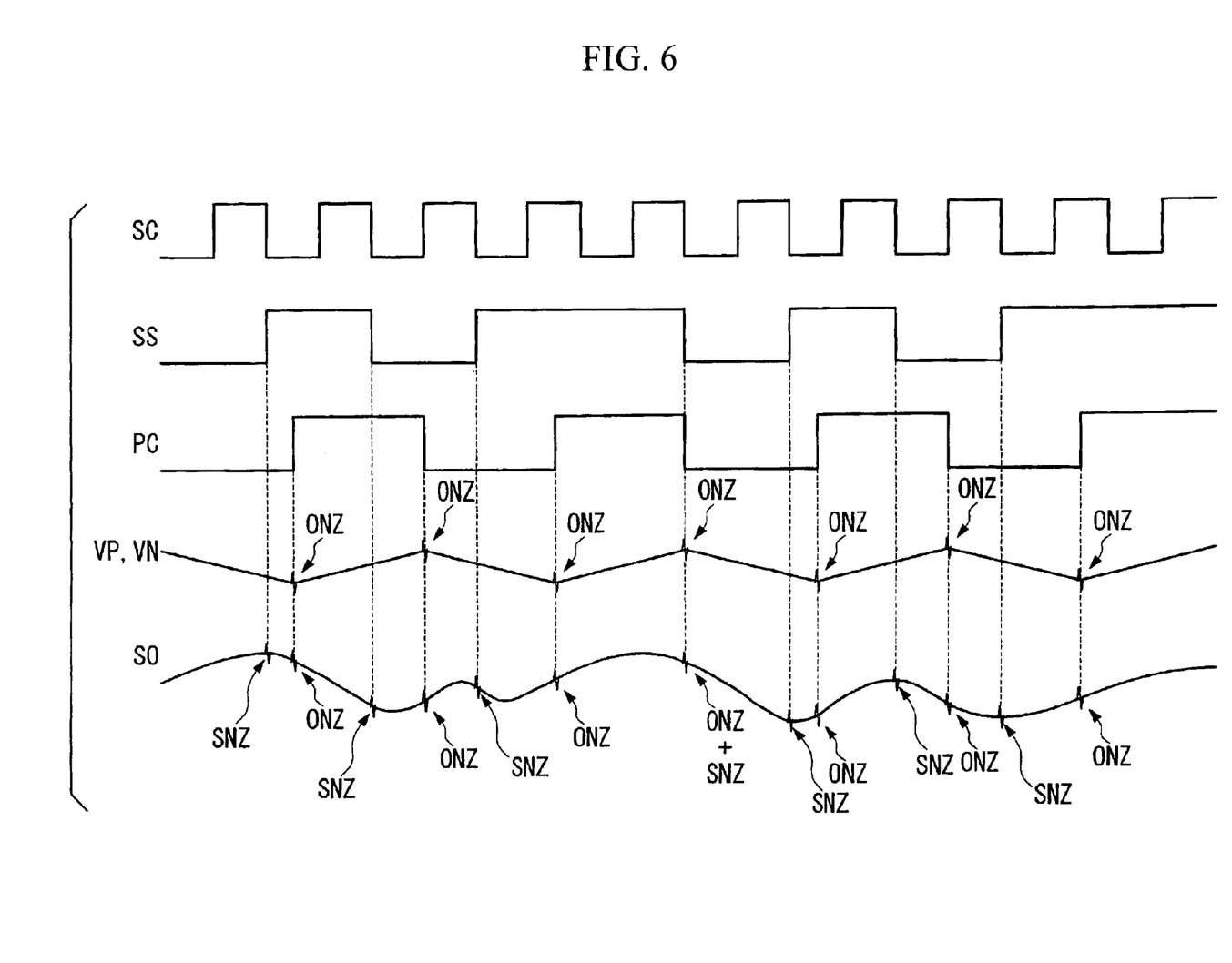
FIG. 6 is a waveform diagram for a comparative explanation of the operation of the present embodiment.

Hereunder, for comparison, is a description of a case where a conventional power supply 6 as shown in FIG. 7 is used, with reference to the waveform diagram shown in FIG. 6. In this case, the switching of the switching element 11 shown in FIG. 2 is controlled by a clock signal PC that is dedicated to the power supply side and that is unrelated to the pulsed signal SS generated by the ΔΣ modulator 2. Accordingly, a case occurs in which the switching clement 11 switches when the power MOS transistors 3A and 3B are on, and the switching noise SNZ is output via the power MOS transistors 3A and 3B.

As a result, the switching noise SNZ caused by the power supply 6 is superimposed onto the output signal SO in addition to the output noise ONZ, with a result that noise on the output signal SO increases compared with the case where the ΔΣ power supply 5 is used.

Accordingly, as compared with the case where the power supply 6 is used the aforementioned embodiment makes it possible to reduce noise occurring on the output signal SO effectively without increasing the size of the output filter 4. which is installed in the audio power amplifier 1, and the filter not shown in the figure) for suppressing the noise on the power supply side. As a result, it is possible to amplify the power of signals with high quality.

In addition, the present embodiment describes a switching amplifier in which an audio power amplifier 1 is installed. However, it a also be used for a switching amplifier in which any other power amplifier for amplifying aa analog signal or a multi bit digital signal is installed.

Furthermore, the present embodiment describes a case where the audio power amplifier 1 uses ΔΣ modulation as a modulating technique. However, the same effect may be obtained using any other modulating technique provided it is a method for modulating an input signal to two states ON and OFF. For example, pulse width modulation may be used.

Moreover, in a case where the switching noise SNZ generated by the ΔΣ power supply and the output noise ONZ on the audio power amplifier side are in an anti-phase relationship, the timing may be set such that these noises interfere intentionally. As a result, the noise on the output signal SO is offset each other. Thus it is possible to effectively reduce the noise further.

Furthermore, in the embodiment described above, the description uses a step down chopper type as the ΔΣ power supply 5. However, a step up type may be used for the ΔΣ power supply 5.

INDUSTRIAL APPLICABILITY

In the present invention, the timing of switching noise occurring in the power amplifier and the power supply is almost the same, so that there is an affect that even if noise from the power supply is mixed in, it is possible to use a common noise filter in the power amplifier. Furthermore, a noise filter for power supply is unnecessary, and it is also not necessary to have a smoothing circuit equipped with a comparatively large-sized capacitor and choke coil in the power supply output, so that there is an effect that the output filter of the power supply can be simplified. Moreover, there is an effect that simplification of the power supply output filter enables the switching amplifier to be miniaturized and cost reduced.

What is claimed is:

1. A switching amplifier, comprising:
   a switching power amplifier which has a modulator which modulates an analog signal or a multi bit digital signal into a two-level signal, and supplies an output pulse signal from the modulator to a power switching element; and
   a ΔΣ power supply which has a ΔΣ modulating device which ΔΣ modulates an analog signal or a multi bit digital signal, and supplies a pulse signal for power supply control output from the ΔΣ modulating device to a power switching element for power supply,
   wherein an output pulse signal of the modulator in the power amplifier is supplied to the ΔΣ power supply, and the output pulse signal is input as an operating clock to the ΔΣ power supply, and the output power of the ΔΣ power supply is supplied to the power switching element in the power amplifier.

2. A switching amplifier comprising:
   a power amplifier having at least a pair of power switching elements in the output stage thereof, which modulates an input signal comprising an analog signal or a multi bit digital signal into a two-level signal, and obtains an output signal power amplified by controlling the conductivity of the power switching elements complimentarily based on the two-level signal; and
   a switching power supply which generates a required power supply voltage to be supplied to the power switching elements by switching in synchronization with the two-level signal.

3. A switching amplifier according to claim 2, wherein an operation timing between the switching power supply and the power amplifier, based on the two-level signal, is set such that noise accompanying the switching operation of the switching power supply occurs within a predetermined period during which the power switching elements installed in the output stage are both off.

4. A switching amplifier according to claim 2, wherein the switching power supply is a ΔΣ power supply, which receives the two-level signal as an operating clock signal.

5. A switching amplifier according to claim 4, wherein the switching power supply comprises:
   a voltage converting section having a switching element inserted in a current path of an external power supply, and which converts the voltage of the external power supply into the required power supply voltage by switching the switching element; and a switching control section which ΔΣ modulates the power supply voltage converted by the voltage converting section, and controls switching of switching elements constituting the voltage converting section based on a signal obtained by the ΔΣ modulation.

6. A switching amplifier according to claim 3, wherein the switching power supply is a ΔΣ power supply, which receives the two-level signal as an operating clock signal.

7. A switching amplifier according to claim 6, wherein the switching power supply comprises:

a voltage converting section having a switching element inserted in a current path of an external power supply, and which converts the voltage of the external power supply into the required power supply voltage by switching the switching element; and a switching control section which ΔΣ modulates the power supply voltage converted by the voltage converting section, and controls switching of switching elements constituting the voltage converting section based on a signal obtained by the ΔΣ modulation.

* * * * *